(12) United States Patent
Pan et al.

(10) Patent No.: US 6,577,431 B2
(45) Date of Patent: Jun. 10, 2003

(54) SYSTEM OF ANGULAR DISPLACEMENT CONTROL FOR MICRO-MIRRORS

(75) Inventors: Cheng-Tang Pan, MiaoLi (TW);
Shin-Chou Chen, Hsinchu (TW);
Gwo-Bin Lee, TaiNan (TW);
Hsien-Min Yang, PaTe (TW);
Chen-Sho Shey, TaiNan (TW)

(73) Assignee: Industrial Technology Research Institute, Hsinchu (TW)

( * ) Notice: Subject to any disclaimer, the term of this patent is extended or adjusted under 35 U.S.C. 154(b) by 180 days.

(21) Appl. No.: 09/880,813

(22) Filed: Jun. 15, 2001

(65) Prior Publication Data

US 2002/0191272 A1 Dec. 19, 2002

(51) Int. Cl.⁷ ............................ G02F 1/09; G02B 26/00
(52) U.S. Cl. ..................... 359/280; 359/291; 359/290
(58) Field of Search ....................... 359/280, 298, 359/320, 324, 318, 224, 291, 290, 214; 385/31, 33, 42, 43, 47

(56) References Cited

U.S. PATENT DOCUMENTS 6,201,629 B1 * 3/2001 McClelland et al. ........ 359/223
6,353,492 B2 * 3/2002 McClelland et al. ........ 359/254
6,379,510 B1 * 4/2002 Kane et al. ............ 204/192.34

* cited by examiner

Primary Examiner—Georgia Epps
Assistant Examiner—Omar Hindi
(74) Attorney, Agent, or Firm—Troxell Law Office PLLC

(57) ABSTRACT

A system of angular displacement control for micro mirrors includes a stationary vertical element, a stationary horizontal element and an interference eliminator. Alternatively, the stationary horizontal element holds micro mirrors in place during transportation for avoiding vibration and collision. The stationary vertical element orientates the micro mirrors in the vertical position. The interference eliminator eliminates magnetic interference that could affect the operation of the micro mirrors. The micro mirrors having interference eliminators are capable of remaining unaffected by operations of other micro mirrors.

32 Claims, 16 Drawing Sheets

SYSTEM OF ANGULAR DISPLACEMENT CONTROL FOR MICRO-MIRRORS

BACKGROUND OF THE INVENTION

1. Field of the Invention

The present invention relates to an optical switch device that controls the angular displacement of micro mirror structures, eliminates the interference of magnetic field from other optical switch device and controls the horizontal displacement of micro mirror structures to prevent vibration and collision in the optical switch device transportation. Further, the present invention is directed to control the displacement and eliminate the interference of micro mirror structures or a plurality of optical switch devices. Alternatively, the present invention also improves the reliability of transporting optical switch devices.

2. Description of the Related Art

Recently several researchers have spurred an increasing development of microstructures in optical communication and micro electro-mechanical systems (MEMS). The microstructures that were not performed in the past are fabricated by a combination of silicon deposition, surface micromachining and bulk-micromachining. A typical optical communication system requires a number of small-sized, high-speed, and highly reliable optical switches for the line switching operation in any applications. The optical switch devices are discussed in detail in Transducers, 1995, entitled "An electrostatically operated torsion mirror for optical switching device" by Hiroshi Toshiyoshi and Hiroyuki Fujita and in Solid-state sensor and actuator, 1998, entitled "Parallel assembly of hinged microstructures using magnetic actuation" by Yang Yi and Chang Liu. Recently, U.S. Pat. Nos. 6,094,293 and 5,960,132 have been disclosed the related information.

The optical switch devices as mentioned previously use electrostatic or magnetic force to control the angular displacement of individual mirror. The incident light is transmitted and passed only when mirror is in the non-reflection state (OFF-state). On the other hand, the incident light is reflected and changed the origin route when the mirror moves between the non-reflection state and the reflection state (On-state). A problem associated with the typical optical switch devices is that precision alignment of mirror is required to control the reflective light's route. The mirror achieves large angular displacements (over 90°) under a torque provided by applying an external magnetic or electrostatic force because the mirror is influenced by the inertia.

FIG. 1 and FIG. 2 show the 3D views and cross-section views of the micro mirror in the prior art. A torsion mirror device 10 is formed on a flat surface of a silicon substrate 11 (or glass substrate). The torsion mirror device 10 includes a bump 15, a reflective mirror 14 and a torsion bar 121 connected the reflective mirror 14 with the first connector section 12a and the second connector section 12b.

Alternatively, first connector section 12a, second connector section 12b, the torsion bar 121, the reflective mirror 14, and the bump 15 are formed by the elastic poly-silicon in the lithography process. The first connector section 12a and second connector section 12b are performed on the silicon substrate 11 and separated by the torsion bar 121. The reflective mirror 14 is formed on the extension part of the middle of the torsion bar 121. A magnetic material 141 (so called permalloy) is performed on the top of the reflective mirror 14. The permalloy 141 is deposited by the way of sputtering or electroplating. The reflective mirror 14 contains a reflective area 142. The reflective area 142 is performed by a smooth plane, which makes the incident light to change the route of the incident light when the incident light approaches the reflective area 142. The bump 15 fixed under the reflective mirror 14 is a square or a rectangle. Furthermore, the height of the bump 15 is suitable for the reflective mirror 14 placed on the bump 15 when the reflective mirror 14 is in the horizontal level. An actuator 16 under the silicon substrate 11 could provide repulsive force to raise the reflective mirror 14.

The conventional rotation mechanism of the reflective mirror 14 is introduced in FIGS. 3–5. As shown in FIG. 3, the torsion mirror device 10 is at rest and the external magnetic field is just applied to the actuator 16. FIG. 4 shows that a torque provided by the actuator 16 makes the torsion mirror device 10 rotate from the horizontal level to vertical level. Thereafter, FIG. 5 shows that the torsion mirror device 10 achieves large angular displacements (over 90°) and doesn't keep stable at the vertical position under the influence of the inertia.

As shown in FIG. 3, when the actuator 16 applying magnetic field results in flux density 161 and the permalloy 141 induces magnetization 163. The positive pole of the flux density 161 and the positive pole of the magnetization 163 result in repulsive force 164. The repulsive force 164 raises the reflective mirror 14 away from silicon substrate 11. Alternatively, the torsion bar 121 which connects with the reflective mirror 14, first connector section 12a and second connector section 12b. When the reflective mirror 14 rotates from the horizontal level to the vertical level, the torsion bar 121 is provided with elasticity to distort under the repulsive force 164. Furthermore, the repulsive force 164 achieves the maximum when the distance between the positive pole of the flux density 161 and the positive pole of the magnetization 163 is shortest.

As shown in FIG. 4, the repulsive force 164 achieves smaller when the distance between the positive pole of the flux density 161 and the positive pole of the magnetization 163 is farther. The torsion bar 121 is so elastic that the reflective mirror 14 moves forward to the vertical position.

As shown in FIG. 5, when the reflective mirror 14 approaches the vertical position, the distance between two positive poles increases further and the repulsive force 164 decreases substantially. The repulsive force 164 approaches zero when the reflective mirror 14 is at a vertical position 17. In the influence of the inertia, the reflective mirror 14 stops at a static position 18 after the orientation mirror 14 rotates over the vertical position 17. The repulsive force 164 is continuously applied to retain the reflective mirror 14 at the static position 18.

FIG. 6 illustrates a cross-section view that the conventional mirror device stays at the static position 18. Although the actuator 16 is not provided by applying external magnetic field anymore, the induced magnetic filed of the permalloy 141 disappears and the reflective mirror 14 influenced by resilience moves back to horizontal level form the static position 18. FIG. 7 shows a cross-section view that the conventional torsion mirror device 10 moves back to the horizontal level. A problem with a reflective mirror 14 similarly described above is that the reflective mirror 14 couldn't retain the horizontal level for the inertia when the reflective mirror 14 moves back. The bump 15 overcomes the problem because the height of the bump 15 is suitable for the reflective mirror 14 stopped on the bump 15.

As shown in FIG. 7, the torsion mirror device 10 isn't fixed by the bump 15 in the horizontal level when the torsion mirror device 10 or an array of torsion mirror devices is transported.

FIG. 8 illustrates the cross-section view of an array of torsion mirror devices 20 in prior art. The array of torsion mirror devices 20 are composed by the sixteen micro mirrors labeled 211, 212, 213, 214, 221, 222, 223, 224, 231, 232, 233, 234, 241, 242, 243 and 244. Among these mirrors, the mirrors labeled 213, 221, 232 and 244 are in the vertical level (reflective state), and therefore beams of incident light 20A, 20B, 20C and 20D are individually reflected by the mirrors labeled 213, 221, 232 and 244 to sensors of 20E, 20F, 20G and 20H. The other mirrors labeled 211, 212, 214, 222, 223, 224, 231, 233, 234, 241, 242 and 243 are set to in the horizontal level. Alternatively, the actuators of the mirrors labeled 213, 221, 232 and 244 are provided by the external magnetic field to retain the mirrors in the vertical level. The other problem is that the actuators described above influence some of the mirrors labeled 211, 212, 214, 222, 223, 224, 231, 233, 234, 241, 242 and 243 so that these mirrors don't retain in the horizontal level. Prior art array of torsion mirror devices 20 could not operate properly if incident or reflective light is obstructed by mirrors not remaining in horizontal position. The present invention proposes an interference eliminator to resolve the above-mentioned problems.

SUMMARY OF THE INVENTION

According, it is a primary object of the present invention is to provide a torsion mirror device or an array of torsion mirror devices, which can positively be retained in the vertical level.

It is another object of the present invention is to provide a torsion mirror device or an array of torsion mirror devices, which can positively be retained in the horizontal level.

It is yet another object of the present invention is to provide a torsion mirror device with function of eliminating magnetic interference, which comes from other torsion mirror device.

To achieve these objects, a system of angular displacement control for micro mirror includes a stationary vertical element, a stationary horizontal element and an interference eliminator. Alternatively, the stationary horizontal element fixes micro mirrors in the transportation to avoid vibrating and colliding. The stationary vertical element orientates the micro mirrors in the vertical position. The interference eliminator eliminates from magnetic interference affecting the operation of the micro mirrors. The micro mirrors with interference eliminators aren't affected by other micro mirrors in the operation process.

DESCRIPTION OF THE PREFERRED EMBODIMENTS

A torsion mirror device crossconnect apparatus of the present invention is hereinafter described. One of ordinary skill in the art would appreciate that the description of the torsion mirror device of the present invention is described by way of example only and that other types of optical switch devices could be used to provide similar features and advantages.

A torsion mirror device 3 is introduced in the present invention to solve the problems described in the related art individually. A torsion mirror device 3 is formed with a stationary vertical element 40, a stationary horizontal element 50 and an interference eliminator 60

Figure 9:
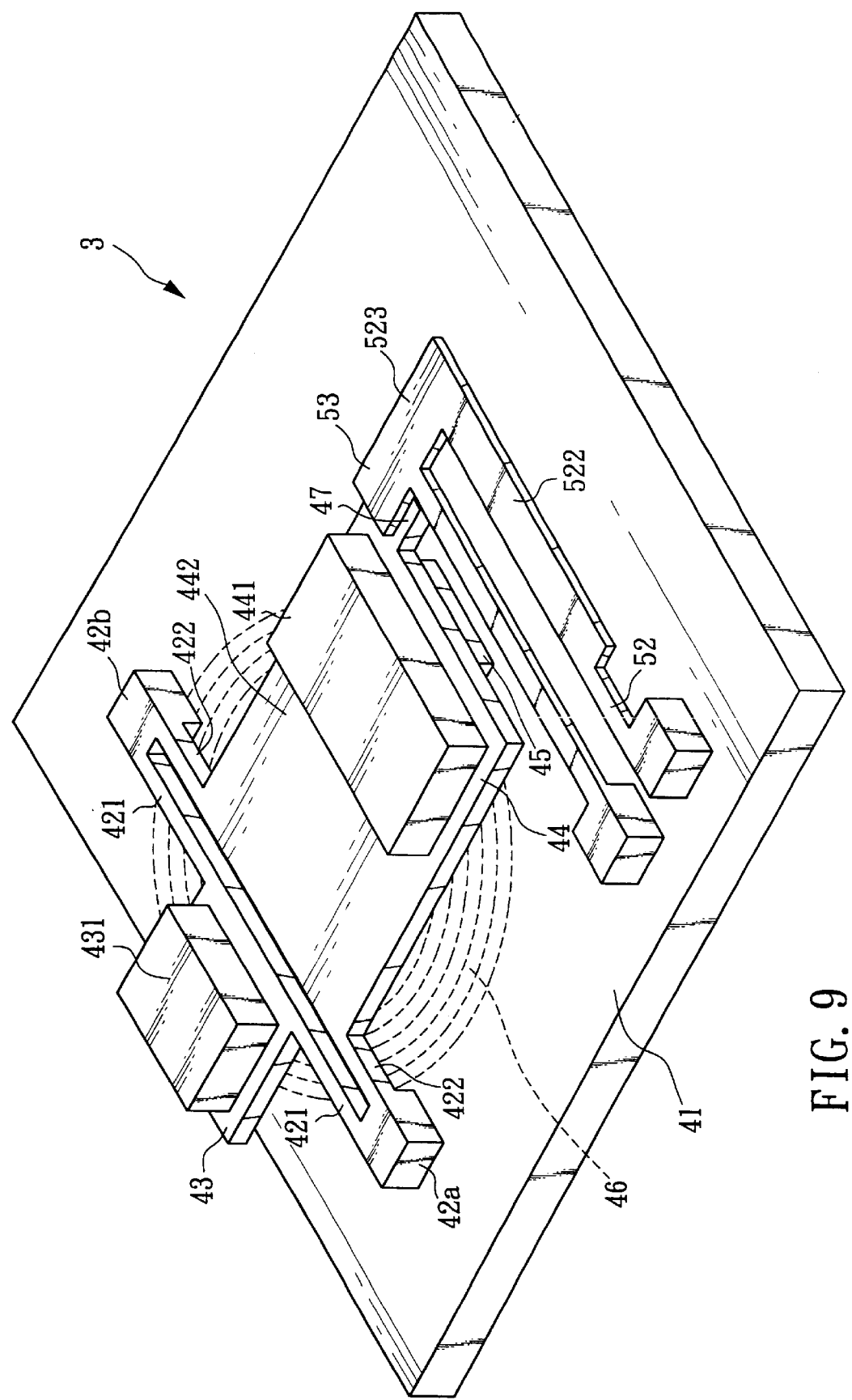
FIG. 9 is a 3D and top view of the torsion mirror device 3 of the first exemplary embodiment.
Figure 10:
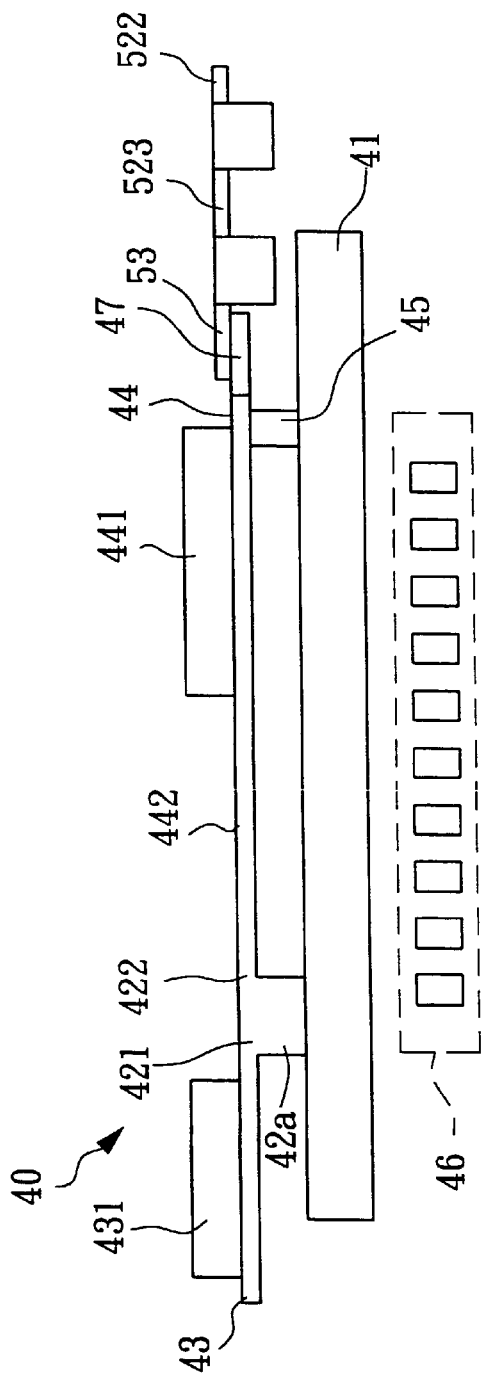
FIG. 10 is a cross-section view of the torsion mirror device 3 of the first exemplary embodiment.

FIG. 9 and FIG. 10 illustrate the 3D views and the top view of the torsion mirror device 3 of the present invention. The first embodiment of the stationary vertical element 40 of the present invention is on a flat surface of a silicon substrate 41 (or glass substrate). The stationary element 40 performed by the lithography process includes a bump 45, an actuator 46, a reflective mirror 44, an orientation mirror 43, the first connector section 42a, the second connector section 42b, the first torsion bar 421 and the second torsion bar 422. The bump 45, the first connector section 42a, the second connector section 42b, the first torsion bar 421, the second torsion bar 422, the orientation mirror 43 and the reflective mirror 44 are fabricated from a stiff yet resilient material such as polysilicon-based materials in the photolithography process. Furthermore, the first connector section 42a and second connector section 42b are performed on the silicon substrate 41 and separated by the first torsion bar 421 and the second torsion bar 422. The first torsion bar 421 is parallel to the second torsion bar 422. The orientation mirror 43 is formed on the extension part of the middle of the first torsion bar 421 and the reflective mirror 44 is formed on the extension part of the second torsion bar 422. Furthermore, the orientation mirror 43 is opposite to the reflective mirror 44.

A magnetic material 141 (so called permalloy) is performed on the top of the reflective mirror 14. The permalloy 141 and the permalloy 142 deposited by the way of sputtering or electroplating are separated on the orientation mirror 43 and the reflective mirror 44. Alternatively, the reflective mirror 44 also contains a reflective area 442 which is a reflective area with equivalent height to change the route of the incident light. The bump 45 under the reflective mirror 14 is a square or a rectangle is fixed on the silicon substrate 41. Furthermore, the height of the bump 45 is suitable for the reflective mirror 44 placed on the bump 45 when the reflective mirror 44 is in the horizontal level. The actuator 46 under the silicon substrate 41 provides the repulsive force to move the reflective mirror 44.

Figure 11:
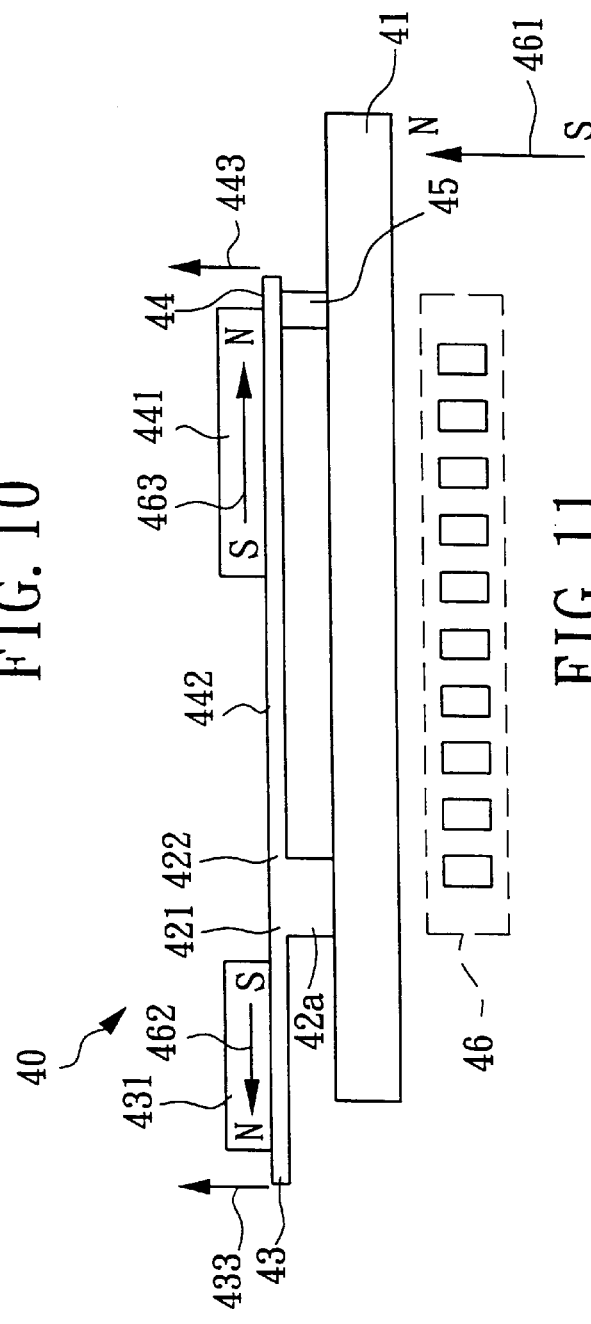
FIG. 11 is a cross-section view of the stationary vertical element 40 of the first exemplary embodiment.
Figure 12:
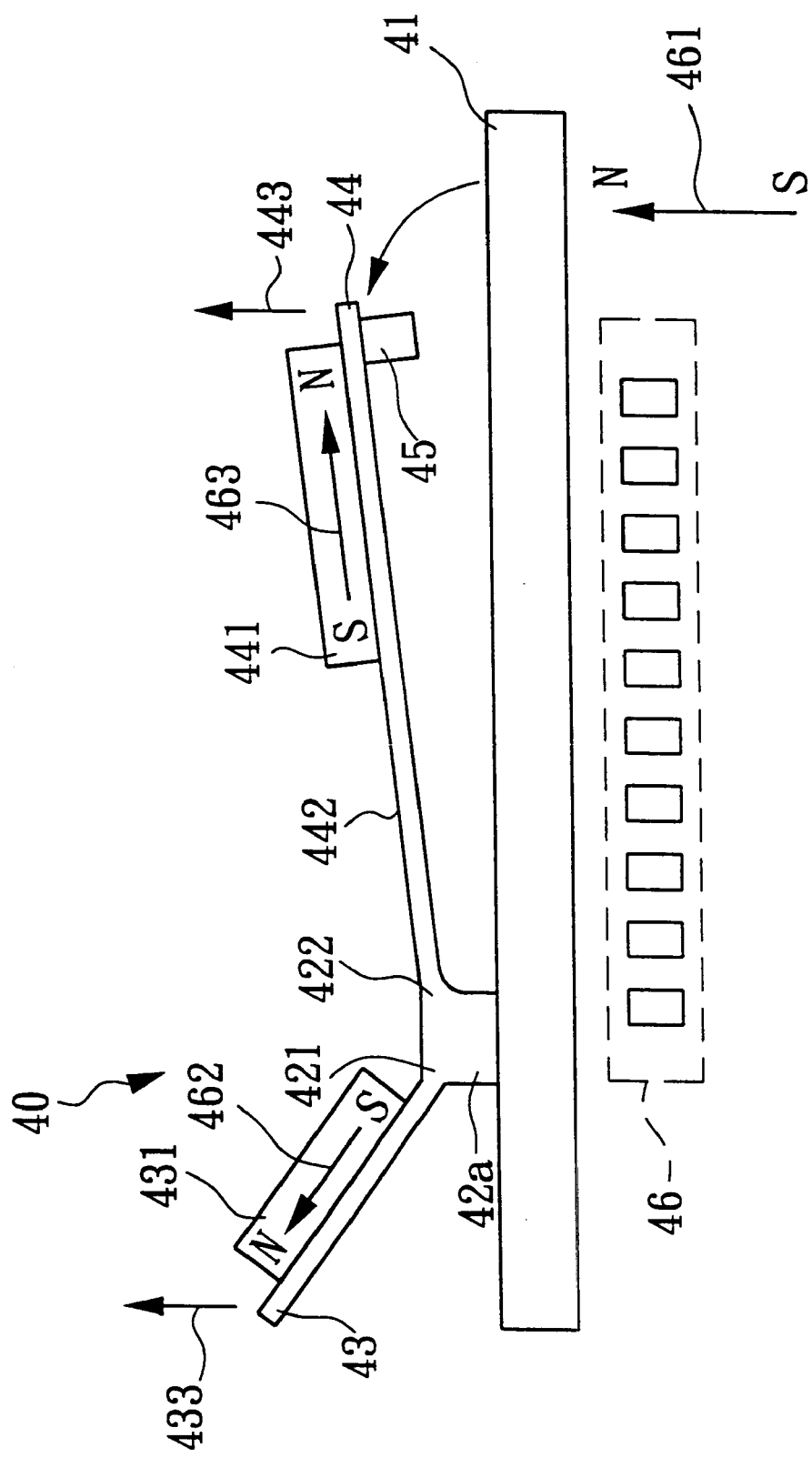
FIG. 12 is a cross-section view of the stationary vertical element 40 of the first exemplary embodiment moving from the horizontal level to the vertical level.
Figure 13:
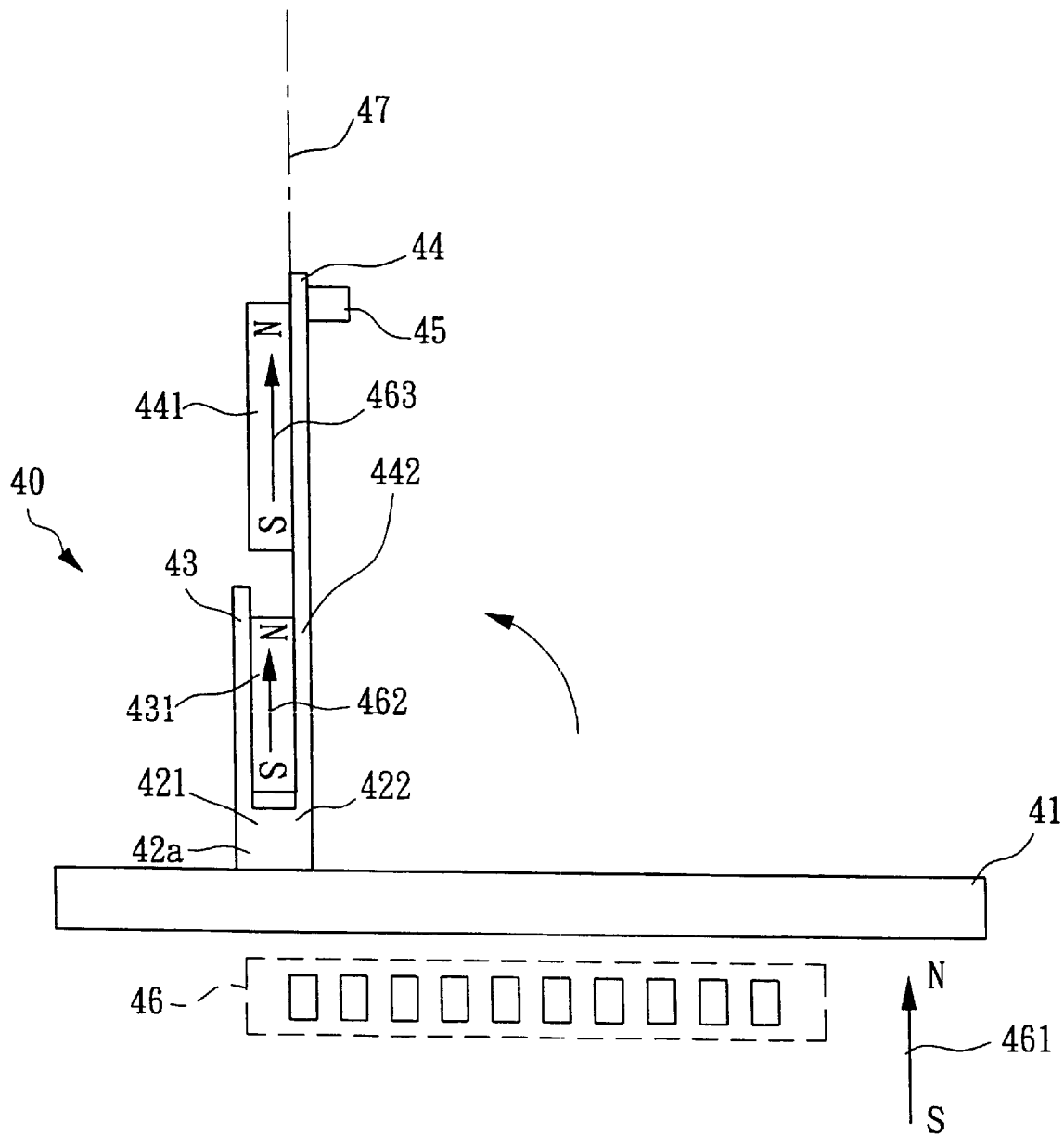
FIG. 13 is a cross-section view of the stationary vertical element 40 of the first exemplary embodiment in the vertical level.

FIG. 11, FIG. 12 and FIG. 13 illustrate the stationary vertical element 40 in the first embodiment of the present invention. As shown in FIG. 11, the stationary vertical element 40 is at rest and the external magnetic field is just applied to the actuator 16. FIG. 12 illustrate that a torque provided by the actuator 46 makes the stationary vertical element 40 rotate from the horizontal level to vertical level. Thereafter, FIG. 13 illustrates that the stationary vertical element 40 achieves in the vertical level.

Figure 1:
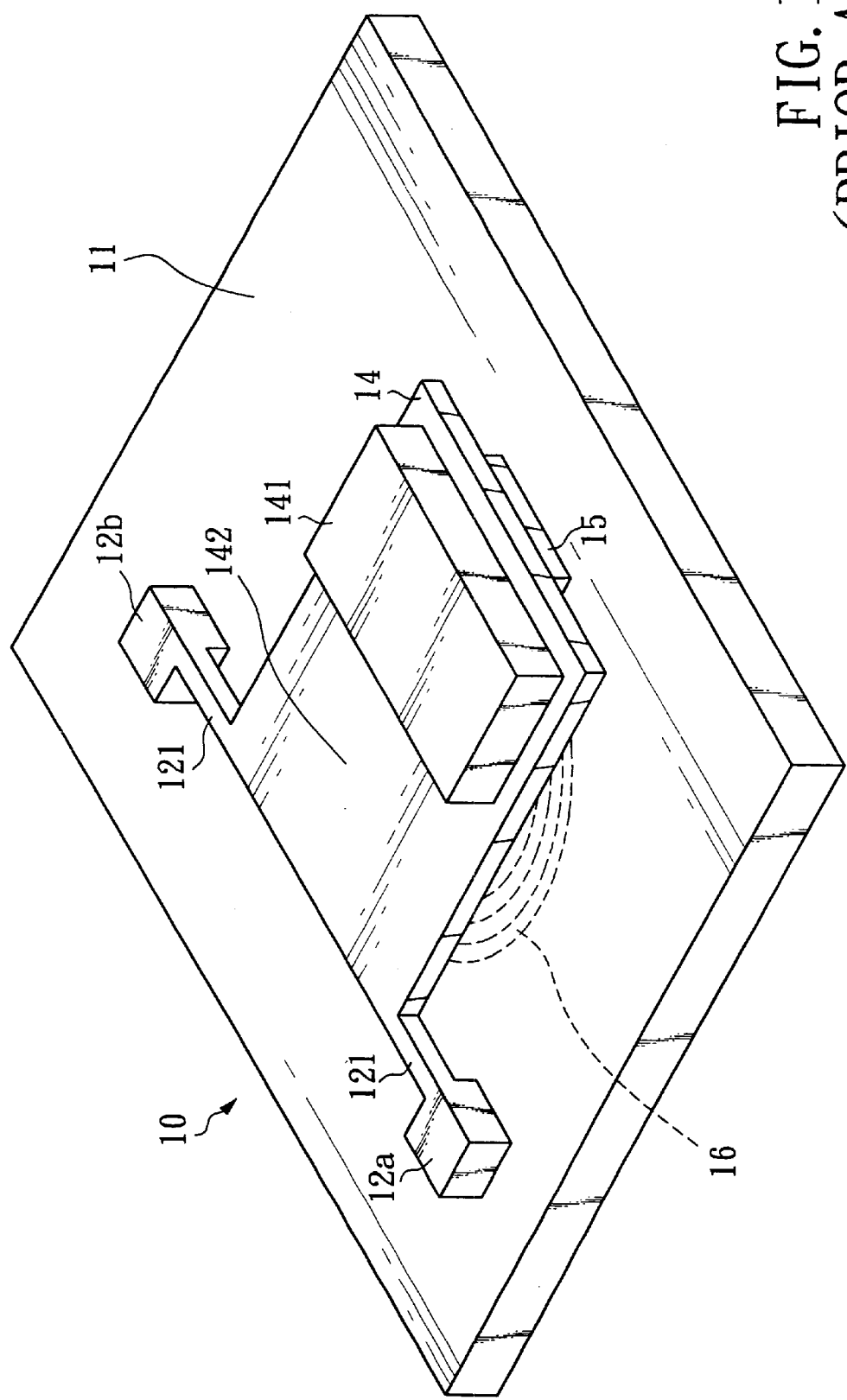
FIG. 1 is a the 3D views and top views of the torsion mirror device 10 in the prior art.
Figure 2:
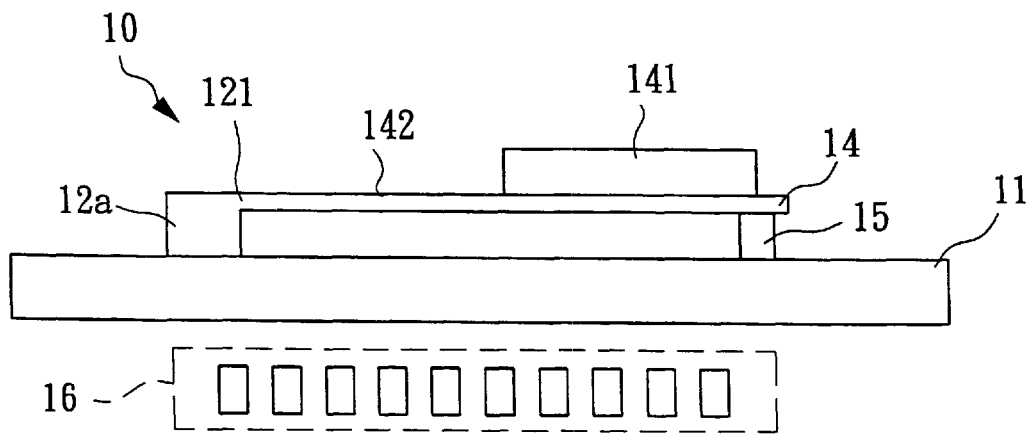
FIG. 2 is a cross-section view of the conventional torsion mirror device 10 shown in FIG. 1.
Figure 3:
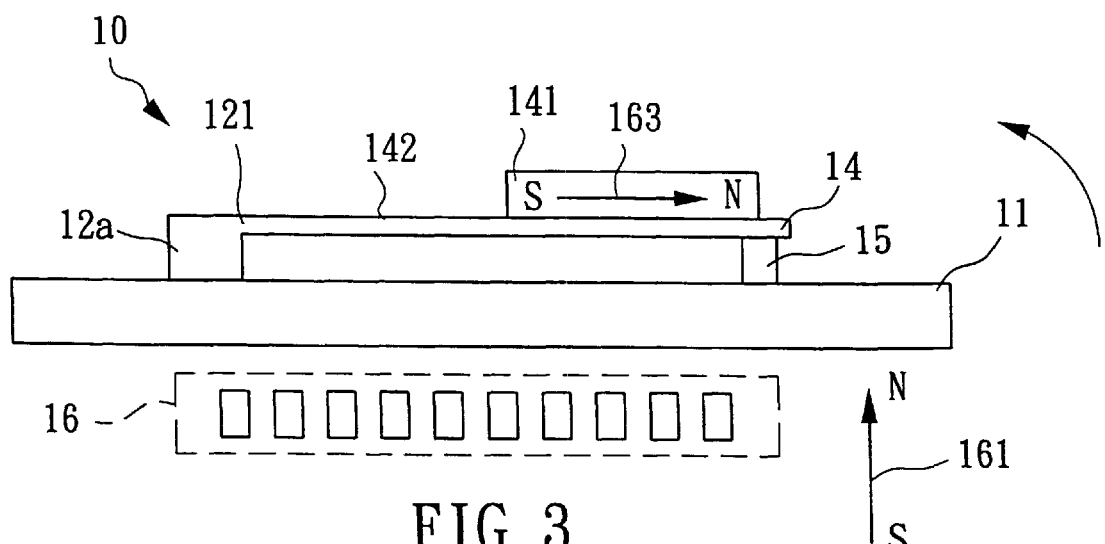
FIG. 3 is a cross-section view of the conventional torsion mirror device 10 shown in the horizontal level.
Figure 4:
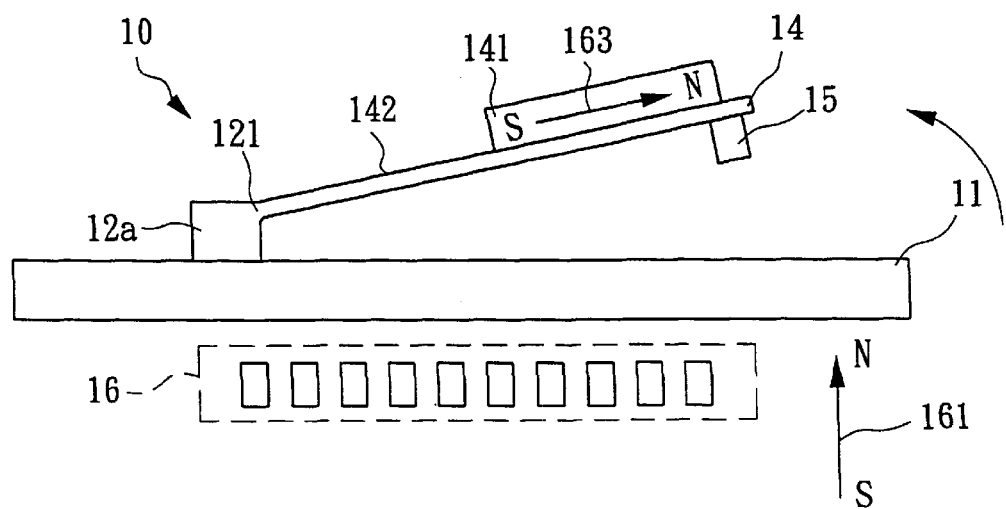
FIG. 4 is a cross-section view of the conventional torsion mirror device 10 shown rotating from the horizontal level to the vertical level.
Figure 5:
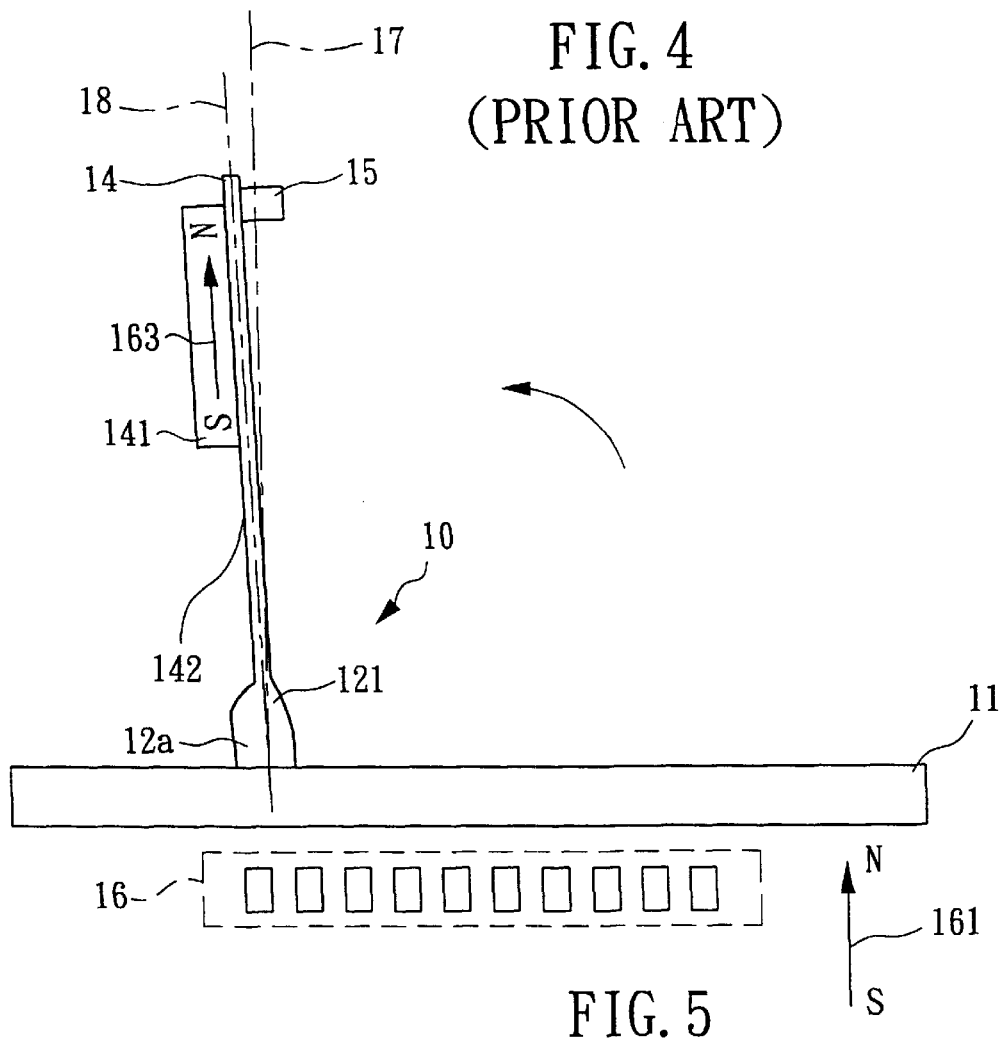
FIG. 5 is a cross-section view of the conventional torsion mirror device 10 which rotates at the static position 18.
Figure 6:
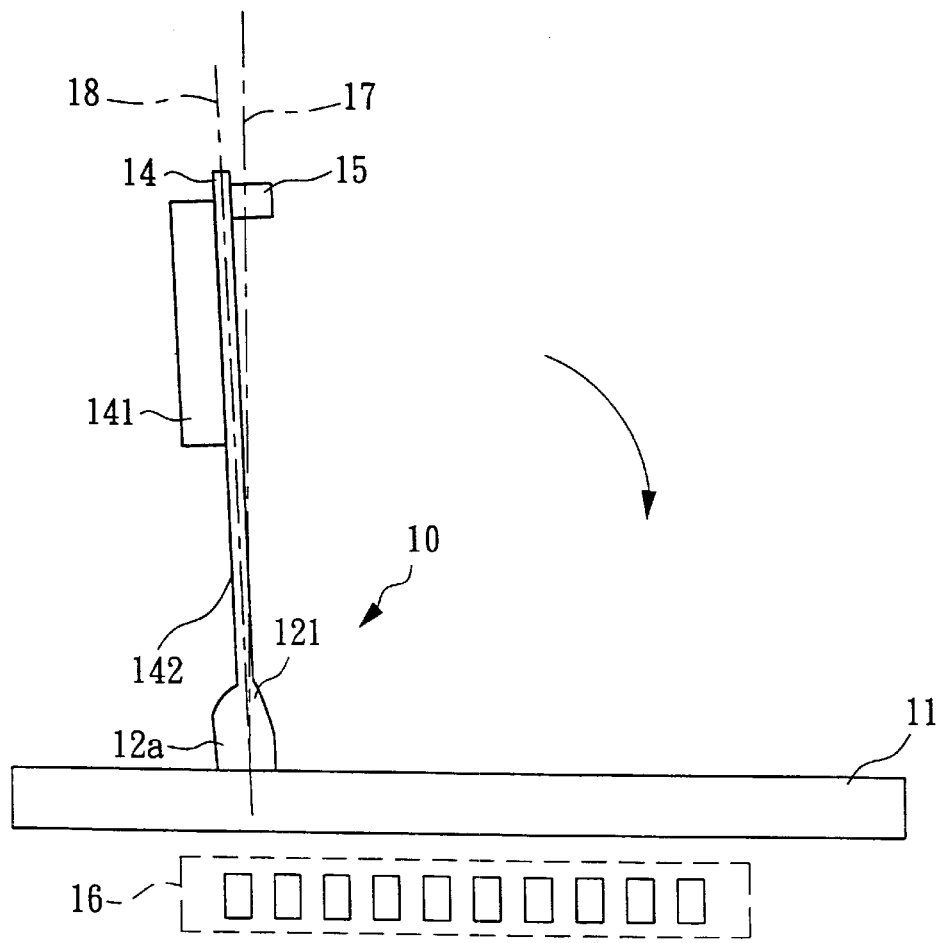
FIG. 6 is a cross-section view of the conventional torsion mirror device 10 which rotates at the static position 18.
Figure 7:
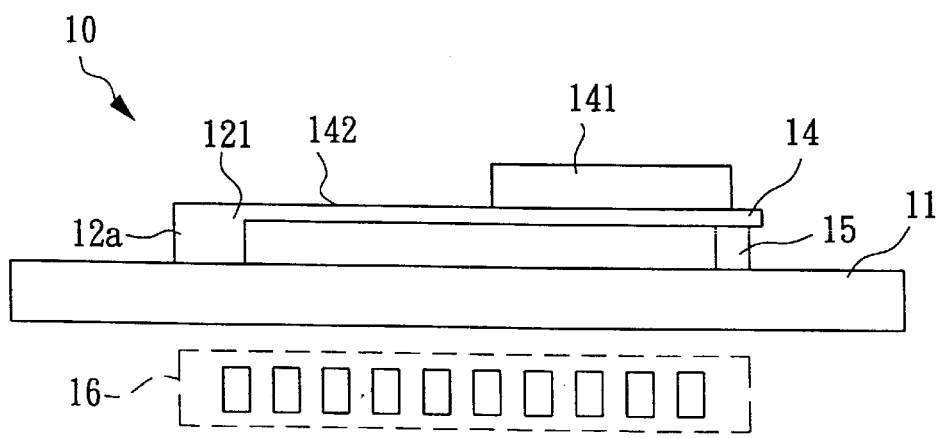
FIG. 7 is a cross-section view of the conventional torsion mirror device 10 shown rotating to the horizontal level.

As shown in FIG. 11, FIG. 12 and FIG. 13, when the actuator 46 applying magnetic field results in flux density 461 and the pennalloy 441 induces magnetization 463. The positive pole of the flux density 461 and the positive pole of the magnetization 463 result in repulsive force 443. The repulsive force 443 raises the reflective mirror 44 away from silicon substrate 41. As same principle shown in FIG. 3, FIG. 4 and FIG. 5, the repulsive force 164 is induced by actuator 16 and the permalloy 141 in ordinary skill in the art. The importance of present invention discloses that the stationary vertical element 40 also contains the first torsion bar 421, the orientation mirror 43 to fix the reflective mirror 44 in the vertical level.

As shown in the FIG. 11, when the actuator 46 applying magnetic field results in flux density 461 and the permalloy 431 induces magnetization 462. The positive pole of the flux density 462 and the positive pole of the magnetization 462 result in the first repulsive force 433. Thereafter, the first repulsive force 433 rotates orientation mirror 43 from the horizontal level to the vertical level. The permalloy 441 induces magnetization 463 in the flux density 461 simultaneously. The positive pole of the flux density 461 and the positive pole of the magnetization 463 result in the second repulsive force 443. The second repulsive force 443 rotates the reflective mirror 44 from the horizontal level to the vertical level. Furthermore, the first repulsive force 433 achieves the maximum when the distance between the positive pole of the flux density 461 and the positive pole of the magnetization 462 is shortest. In the same way, the second repulsive force 443 achieves the maximum when the distance between the positive pole of the flux density 461 and the positive pole of the magnetization 463 is shortest.

As shown in FIG. 12, the orientation mirror 43 and the reflective mirror 44 rotate form the horizontal level to the vertical level individually when the first repulsive force 433 and the second repulsive force 443 act. Besides, the first repulsive force 433 and the second repulsive force 443 achieve smaller when the distance between two magnetic fields is farther. Thereafter, the first torsion bar 421 and the second torsion bar 422 are so elastic that the orientation mirror 43 and the reflective mirror 44 move forward to the vertical position. It is deserved to be mentioned that the orientation mirror 43 moves faster than the reflective mirror 44 because the orientation mirror 43 has less mass than the reflective-mirror 44.

As shown in FIG. 13, when the orientation mirror 43 approaches the vertical position, the distance between two positive poles increases further and the first repulsive force 443 influencing the orientation mirror 43 decreases substantially. The first repulsive force 443 approaches zero when the orientation mirror 43 is at the vertical position 17. In the influence of the inertia, the orientation mirror 43 stops after the orientation mirror 43 rotates over the vertical position 17. The reflective mirror 44 rotates after the orientation mirror 43. The rotation situation of the reflective mirror 44 is as same as the orientation mirror 43. Alternatively, the first repulsive force 443 approaches zero when the reflective mirror 44 is at the vertical position 47. The problem that the reflective mirror 44 rotates over the vertical position 47 is resolved by the existence of the orientation mirror 43. The inertia formed by the orientation mirror 43 and the inertia formed by the reflective mirror 44 cancel out so that the reflective mirror 44 and the reflective mirror 44 touch each other and stop at the vertical position 47. Alternatively, the factors which influences the reflective mirror 44 is in the vertical level are the mass and the torque of the orientation mirror 43 compared with the reflective mirror 44 and the axle arm and the resilience of the first torsion bar 421 compared with the second torsion bar 422. The stationary vertical element 40 is optimized through the material selection, and experiment. Laser beams from different directions are reflected by the reflective mirror 44 and then reach expectant sensors in order to check if the reflective mirror 44 is in the vertical level.

Figure 14:
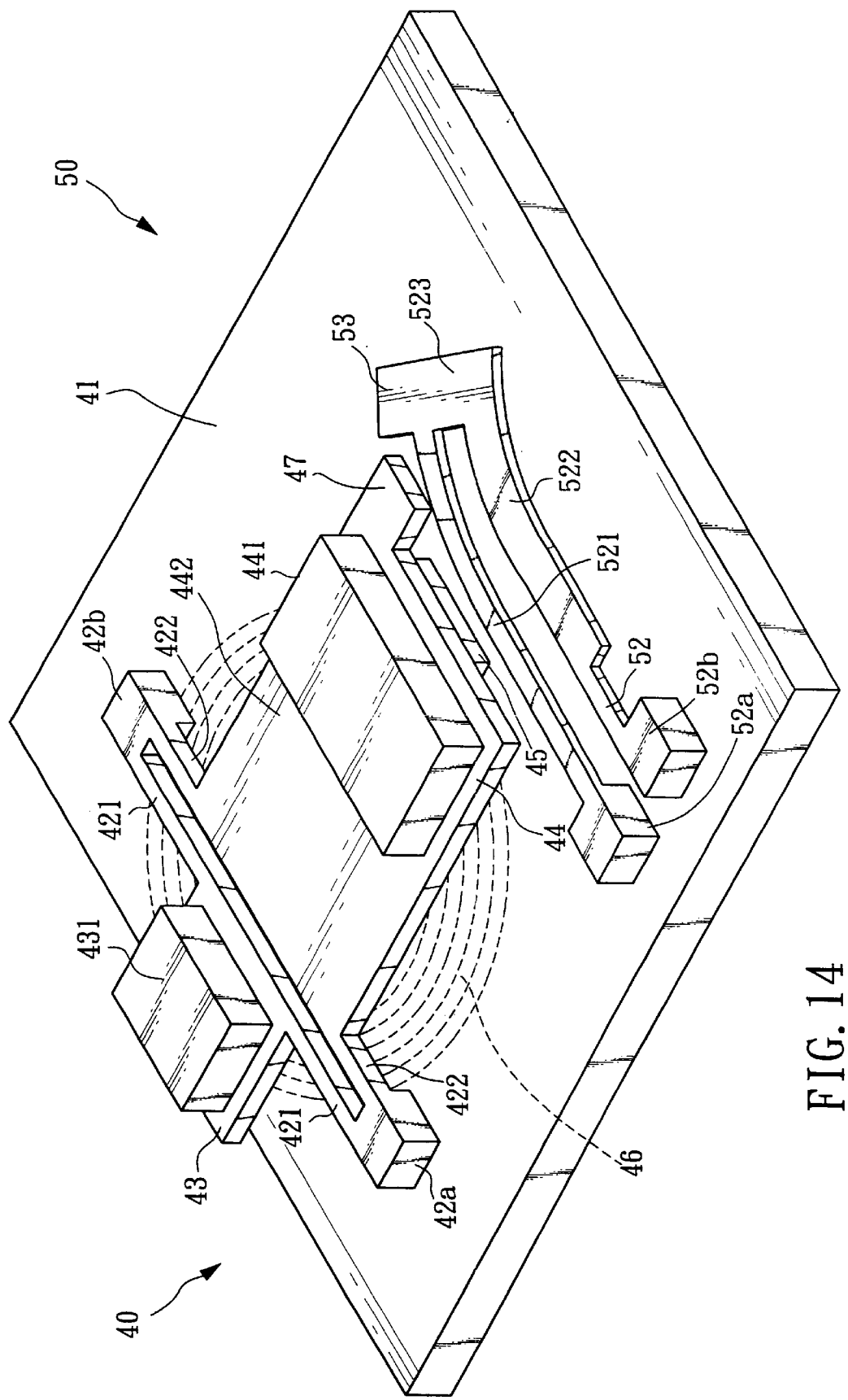
FIG. 14 is a top view of the stationary horizontal element 50 in the electric conductive state of the first embodiment.
Figure 15:
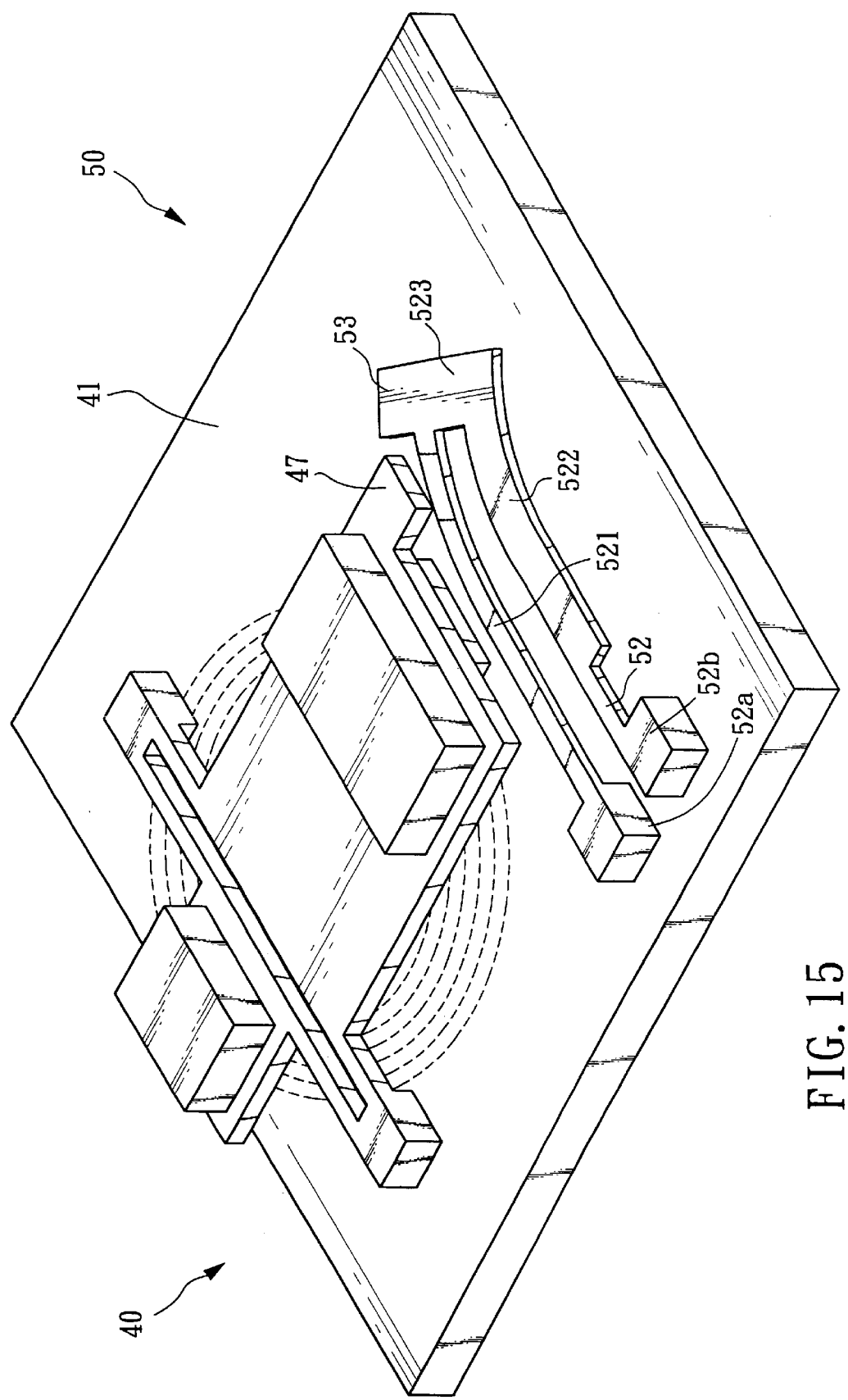
FIG. 15 is a top view of the stationary horizontal element 50 in the nonconductive state of the first embodiment.

FIG. 14 illustrates the top view of the stationary horizontal element 50 in the electric conductive state of the first embodiment. FIG. 15 illustrates the top view of the stationary horizontal element 50 in the nonconductive state of the first embodiment. The stationary horizontal element 50 includes the first electrode 52a, the second electrode 52b, the first axle arm 521, the second axle arm 522, a connective axle arm 523 and a tenon 53. Alternatively, the mirror includes a bulge 47 with corresponding the tenon 53. The first electrode 52a, the second electrode 52b, the first axle arm 521, the second axle arm 522, the connective axle arm 523, the tenon 53 and the bulge 47 are fabricated from a conductive material such as copper alloy or aurum alloy in the photolithography process. Furthermore, the first electrode 52a and second electrode 52b are performed on the silicon substrate 41 and separated by a suitable distance. The first axle arm 521 and second axle arm 522 are parallel to each other or approximately parallel. The second axle arm 522 is thicker than the first axle arm 521. Alternatively, the first axle arm 521 and the second axle arm 522 are in the suspension mode. An end of the first axle arm 521 is fixed on the first electrode 52a and the other end is fixed on the connective axle arm 523. An end of the second axle arm 522 is fixed on the first electrode 52b and the other end is also fixed on the connective axle arm 523. As mentioned previously, the connective arm 523 connects the first axle arm 521 and the second axle arm 522 to form a horizontal suspension circuit.

As shown in FIG. 13, the orientation mirror 43 is in the vertical state and then the control program sends commands to quit the power of the actuator 46. The first permalloy and the second permalloy 441 stop to induce magnetization. The first repulsive force 433 and the second repulsive forcer 443 don't operate any more. The orientation mirror 43 and the reflective mirror 44 individually move form the vertical level to the horizontal level under the resilience of the first torsion bar 421 and the second torsion bar 422. The bump 45 cancels the inertia of the rotation and stops the reflective mirror 44 from rotating over the horizontal level. The stationary horizontal element 50 forms the horizontal suspension circuit between the first electrode 52a and the second electrode 52b. The circuit of the first axle arm 521, the connective axle arm 523 and the second axle arm 522 are performed by the same metal material with the same coefficient of expansion. When the circuit is in the conductive state, the larger area of the second axle arm 522 results in lower resistance and lower temperature than the first axle arm 521. The thermal expansion volume of the second axle arm 521 should be larger than the first axle arm 522. In the same way, the length of the second axle arm 521 increases larger than the first axle arm 522 in the conductive state as shown in FIG. 15. Thereafter, the first axle arm 521 and the second axle arm 522 are bent to the right hand side. Alternatively, the influence of the thermal expansion in the first axle arm 521 is much stronger than the second axle arm 522 so that the influence in the second axle arm 522 is ignored.

When the reflective mirror 44 is static in the horizontal level and the stationary horizontal element 50 is in the conductive state, the control program sends commends to quit the power of the horizontal suspension circuit. As shown in FIG. 15, the resistance, the temperature increase and thermal expansion in the first axle arm 521 and the second axle arm 522 disappear after the power of the circuit quits. Thereafter, the first axle arm 521, the second axle arm 522 and the connective arm 523 gradually recover their original shapes and positions. The tenon 53 is moved left over the top of the bulge 47 and touches the bulge 47 in the recovery procedure. The reflective mirror 44 is static in the transportation because the tenon 53 is on the bulge 47. That the stationary horizontal element 50 is in the conductive state prevents the torsion mirror device 3 from displacement and damage when the micro mirror is shook and collided in the transportation.

Figure 8:
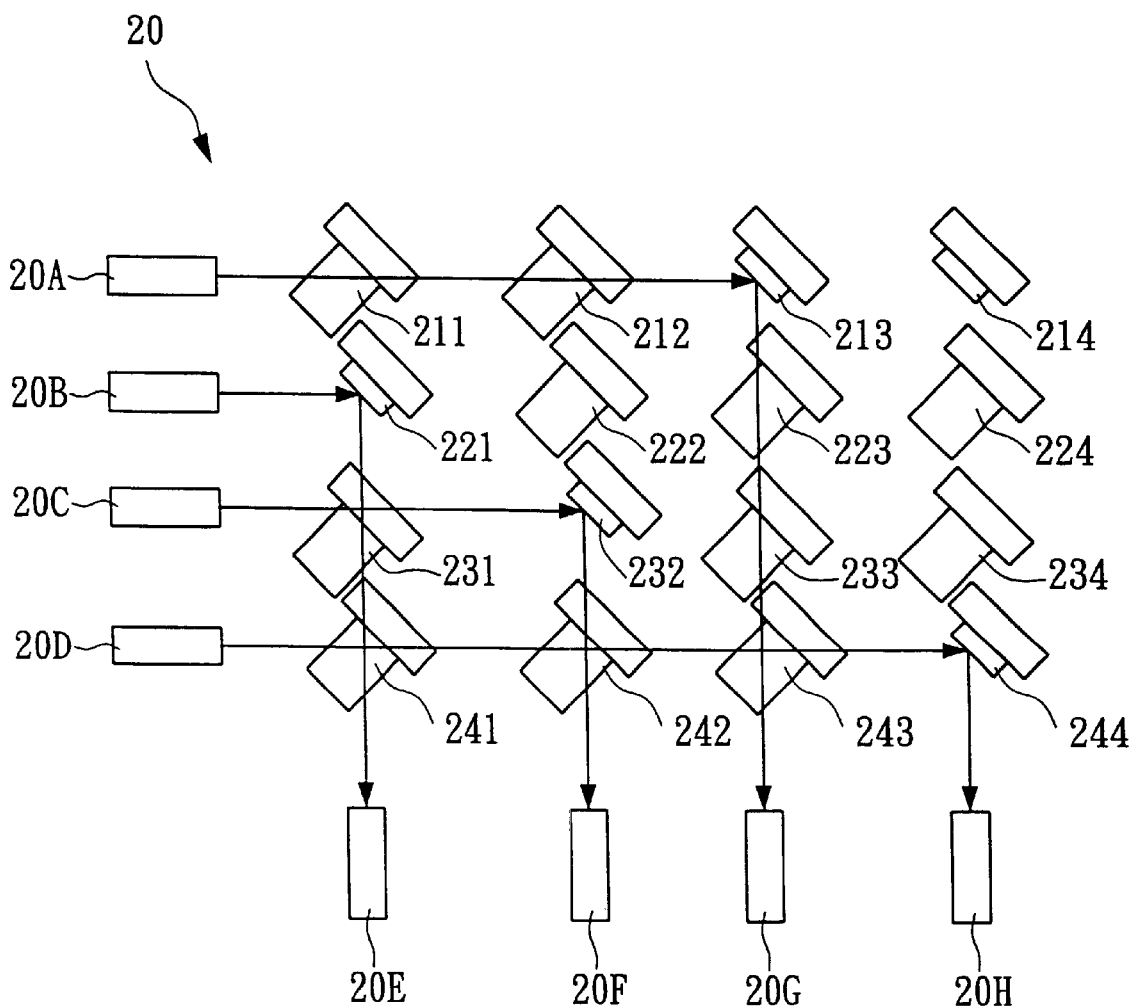
FIG. 8 is a top view of the conventional array of the micro mirror.
Figure 16:
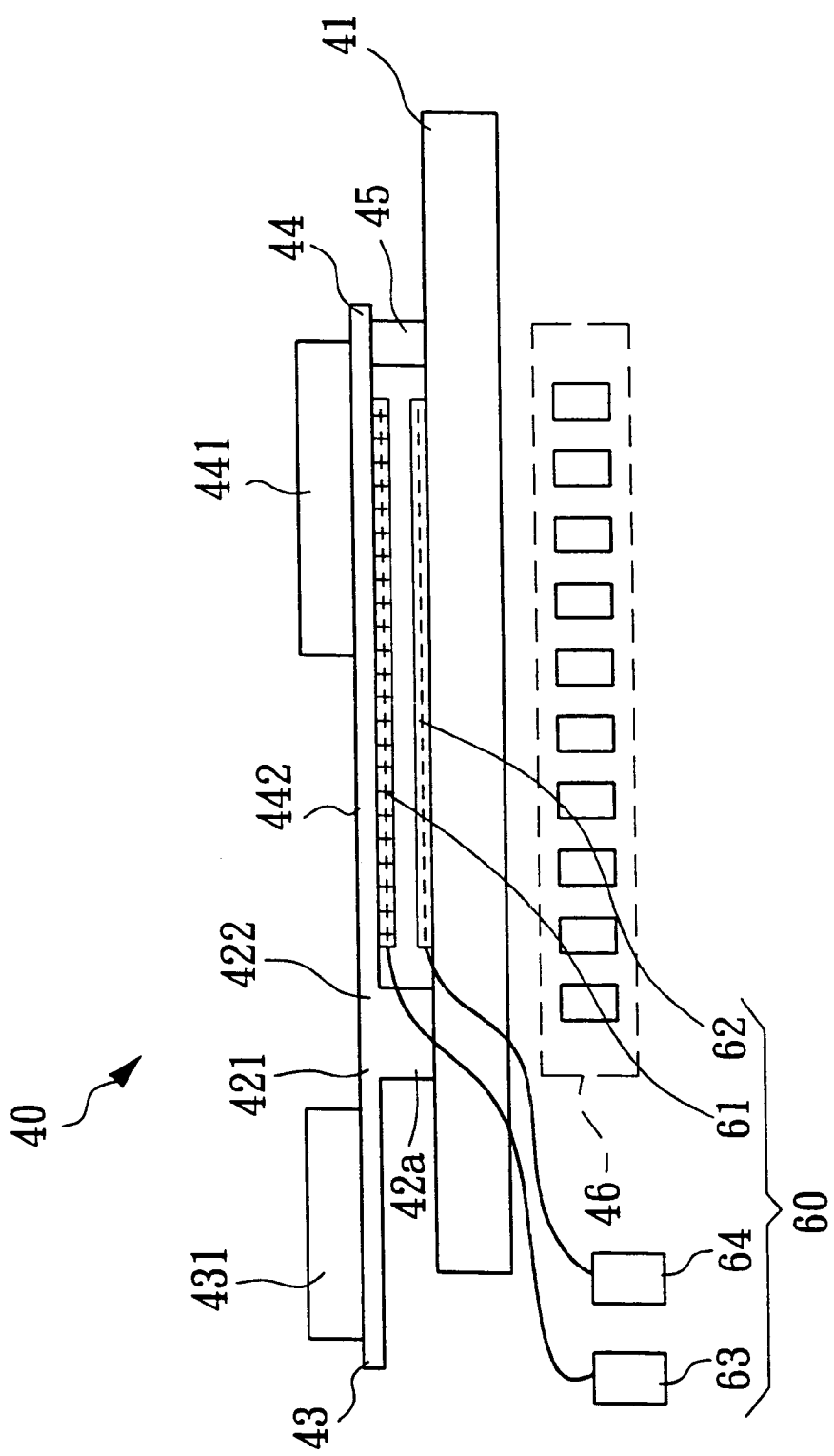
FIG. 16 is a cross-section view of the interference eliminator 60 of the first exemplary embodiment.

A problem is that the micro mirror in the prior art is affected by neighboring magnetic field and then the micro mirror rotates slightly. Thereafter, the micro mirror intercepts the incident light or the reflective light and the array of the micro mirror is in the abnormal state as shown in FIG. 8. The torsion mirror device 3 of the present invention discloses interference eliminator 60 to solve the problem. FIG. 16 shows top view of the interference eliminator 60 of the first embodiment in the present invention. The interference eliminator 60 includes the first conductive film 61 of the reflective mirror 44 and the second conductive film 62 of the silicon substrate 41. The first conductive film 61 and the second conductive film 62 are deposited by the way of sputtering or electroplating. Alternatively, the first conductive film 61 is below the reflective mirror 44 when the reflective mirror 44 is in the horizontal level and the second conductive film 62 is above the silicon substrate 41 corresponding the first conductive film 61. The operation way: the first conductive film 61 is conductive with the first supply 63 and the second conductive film 62 is conductive with the second supply 64. Furthermore, the first conductive film 61 is provided opposite charge to the second conductive film 62. For the first exemplary embodiment of the present invention, the first conductive film 61 is provided with positive charge and the second conductive film 62 is provided with negative charge. The reflective mirror 44 is static in the horizontal level for the electrostatic induction (positive and negative charge attract each other) when the actuator of other micro mirror induces the magnetization. As shown in FIG. 8, the interference eliminators 60 are individually set up on the mirrors labeled 211, 212, 214, 222, 223, 224, 231, 233, 234, 241, 242 and 243 in the horizontal level. These horizontal mirrors are unaffected by the actuators of the mirrors labeled 213, 221, 232 and 244 inducing magnetization in the vertical level. In the same way, the interference eliminators 60 are set up on the mirrors labeled 213, 221, 232 and 244. The mirrors labeled 213, 221, 232 and 244 are unaffected by the actuators of the other mirrors and static in the horizontal level.

Figure 17:
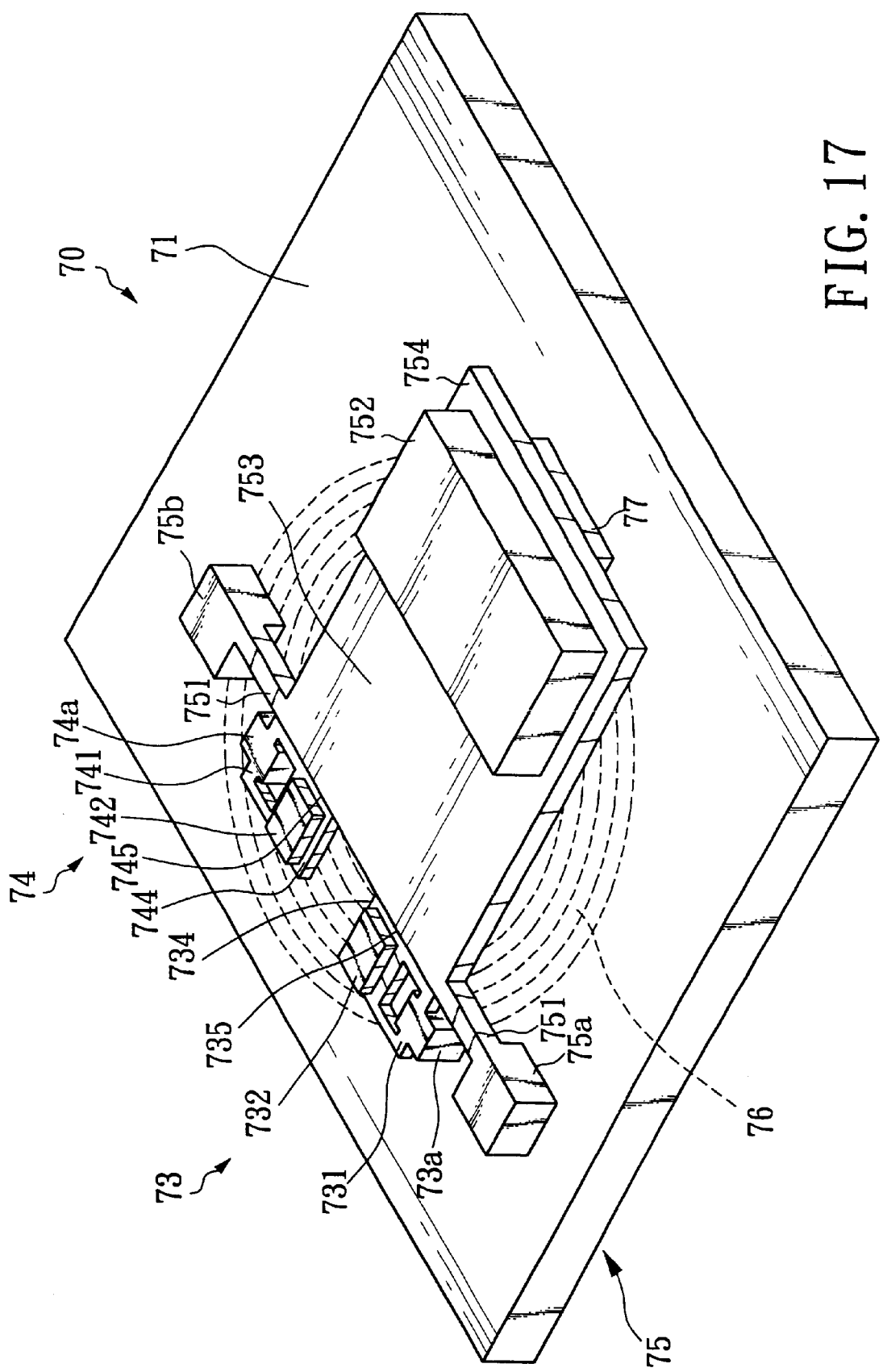
FIG. 17 is the 3D view of a stationary vertical element 70 of the second exemplary embodiment.

FIG. 17 shows the 3D view of a stationary vertical element 70 of the second exemplary embodiment of the present invention. On a flat silicon substrate 71, a stationary vertical element 70 is formed by lithography process. The stationary vertical element 70 includes the first fixed position element 73, the second fixed position element 74, a reflective element 75, an actuator 76 and a bump 77.

Alternatively, the first fixed position element 73 includes the first connector section 73a, the first torsion bar 731, the first orientation mirror 734 and the first side 735. The second fixed element 74 includes the second connector section 74a, the second torsion bar 741, the second orientation mirror 744 and the second side 745. The reflective element 75 includes a third connector section 75a, a fourth connector section 75b, a third torsion bar 751 and a reflective mirror 754. The actuator 76 is under the silicon substrate 71 to provide a repulsive force for pushing the reflective mirror 754. The bump 77 is fixed under the reflective mirror 754 is a square or a rectangle. The bump 77 is suitable for the reflective mirror 754 placed on the bump 77 when the reflective mirror 754 is in the horizontal level.

The first connector section 73a, the first torsion bar 731 and the first orientation mirror 734 are performed by the elastic poly-silicon in the lithography process. The first connector section 73a is fixed on the silicon substrate 71. The first torsion bar 731 is built on the first connector section 73a with the suspension mode. The first orientation mirror 734 is formed on the extension part of the middle of the first torsion bar 731. The first permalloy 732 on the first orientation mirror 73 is formed by the sputtering and electroplating process. The first side 735 is perpendicular to the first torsion bar 731.

The second connector section 74a, the second torsion bar 741 and the second orientation mirror 744 are performed by the elastic poly-silicon in the lithography process. The second connector section 74a is fixed on the silicon substrate 71. The second torsion bar 741 is built on the second connector section 74a with the suspension mode. The second torsion bar 741 is parallel to the first torsion bar 731. The second orientation mirror 744 is formed on the extension part of the middle of the second torsion bar 741. The second orientation mirror 744 and the first orientation mirror 734 are built between the first torsion bar 731 and the second torsion bar 741. The second permalloy 742 on the second orientation mirror 74 is formed by the sputtering and electroplating process. The second side 745 is perpendicular to the second torsion bar 741.

The reflective element 75, the third connector section 75a, the fourth connector section 75b, the third torsion bar 751 and the reflective mirror 754 are performed by the elastic poly-silicon in the lithography process by the lithography process. The third connector section 75a and the fourth connector section 75b are performed on the silicon substrate 71 and separated by a suitable distance. The third torsion bar 751 is built between the third connector section 75a and the fourth connector section 75b with the suspension mode. The third torsion bar 751 is perpendicular to the first torsion bar 731 and the second torsion bar 741. The third orientation mirror 754 is formed on the extension part of the middle of the third torsion bar 751. The reflective mirror 754, the first fixed element 73 and the second fixed element 74 are performed on both sides of the third torsion bar 751. The third permalloy 752 on the third reflective mirror 754 is formed by the sputtering and electroplating process. Furthermore, the reflective mirror 754 includes a reflective area 753, which is a flat area to change the incident route after incident light being reflected by the reflective area 753.

Figure 18:
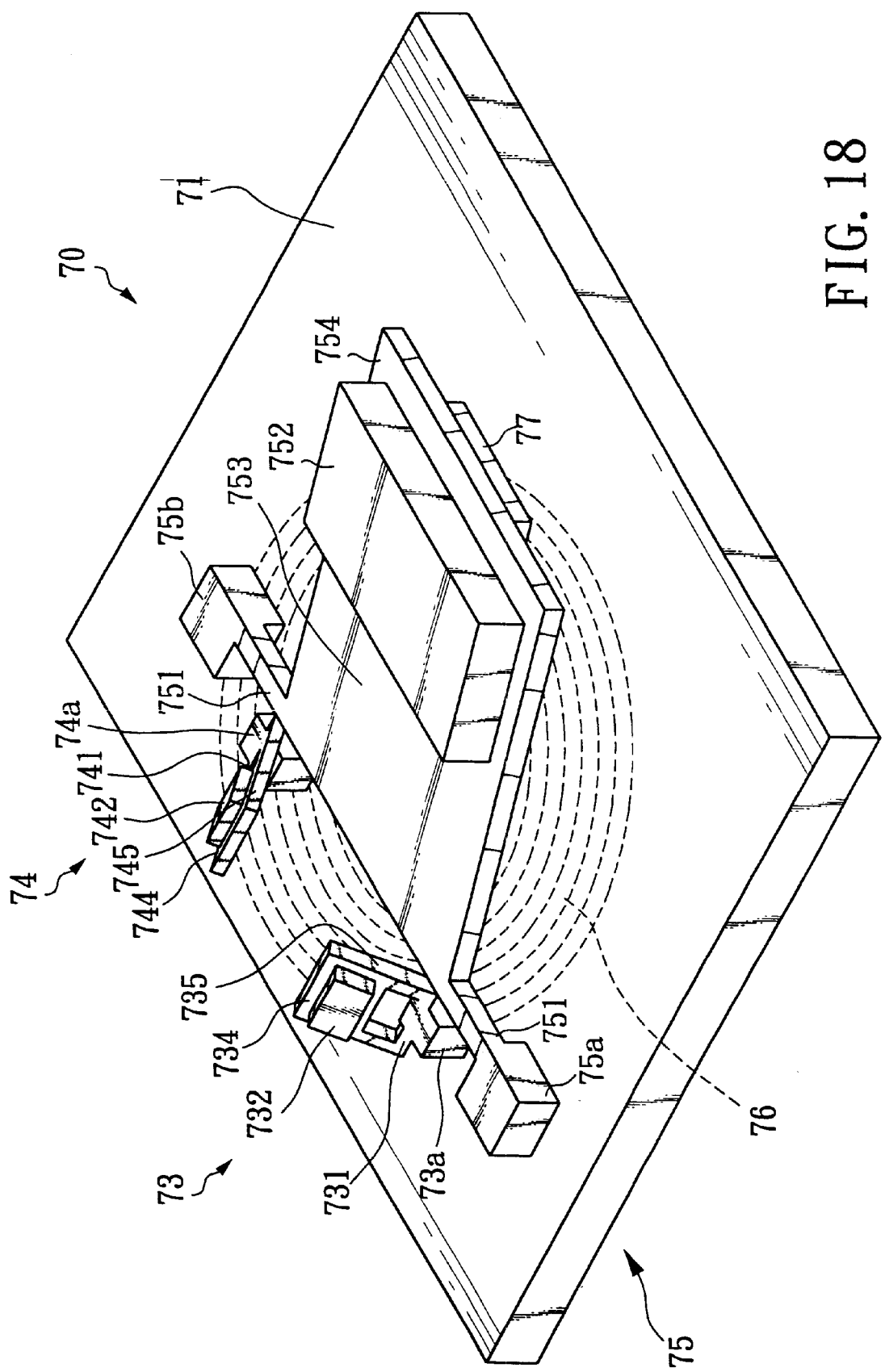
FIG. 18 is a 3D view of the stationary vertical element 70 of the second exemplary embodiment moving to the vertical level.
Figure 19:
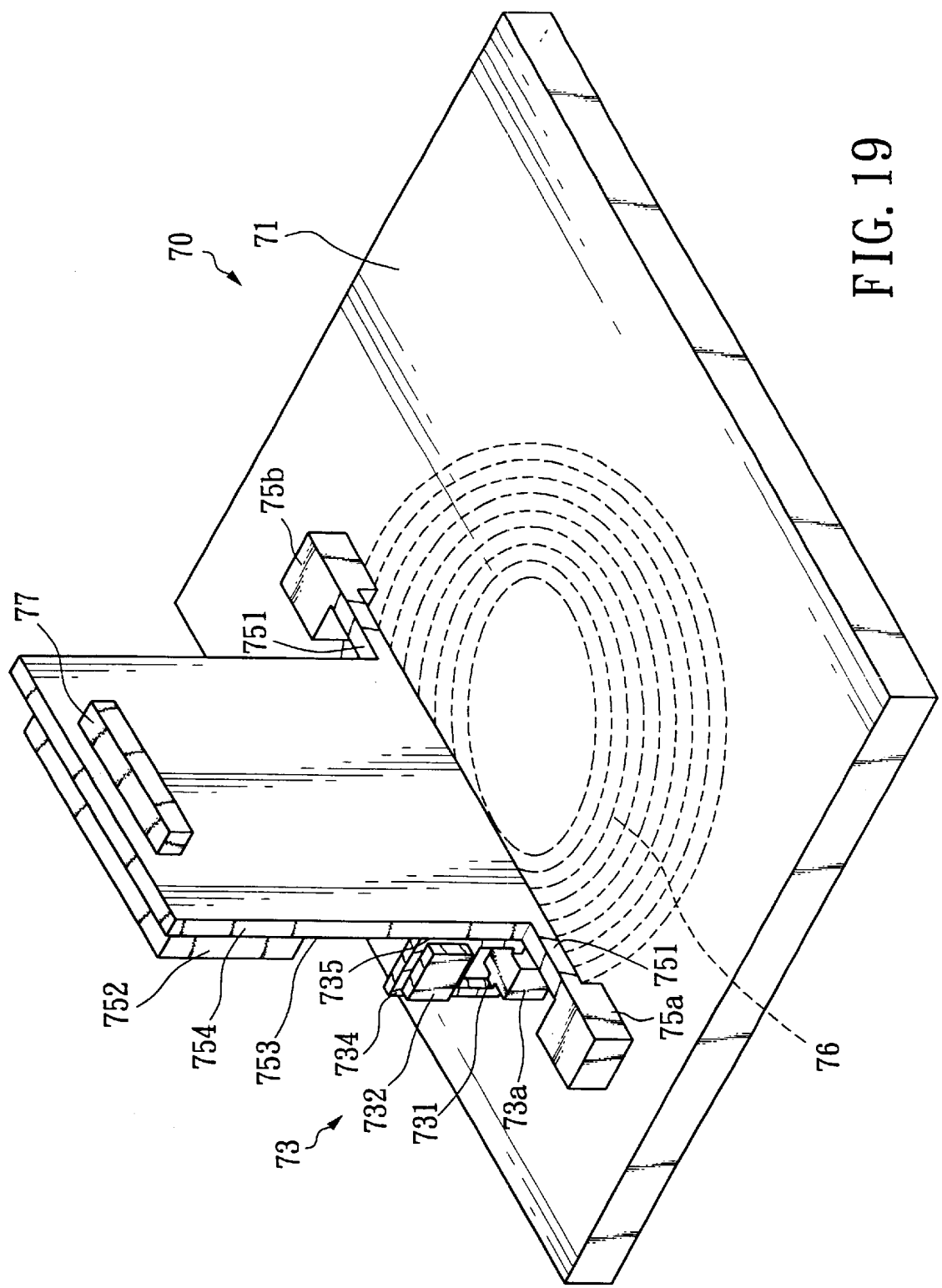
FIG. 19 is a 3D view of the stationary vertical element 70 of the second exemplary embodiment in the vertical level.

FIG. 18 shows a 3D view of the stationary vertical element 70, which rotates to the vertical level in the second exemplary embodiment. FIG. 19 shows a 3D view of the stationary vertical element 70 static in the vertical level. After the actuator 76 is powered, the rotation principles of the first fixed position element 73 and the second fixed position element 74 and the reflective mirror 754 are similar to the rotation principles of the stationary vertical element 40 as shown in FIGS. 11, 12 and 13. With reference FIG. 18, the first orientation mirror 734 and the second orientation mirror 744 are individually rotated from the horizontal level to the vertical level. The mass of the first orientation mirror 734 and the second orientation mirror 744 are less than the mass of the reflective mirror 44. Thereafter, the rotation rate of the first orientation mirror 734 and the second orientation mirror 735 is faster than the reflective mirror 44.

Figure 20:
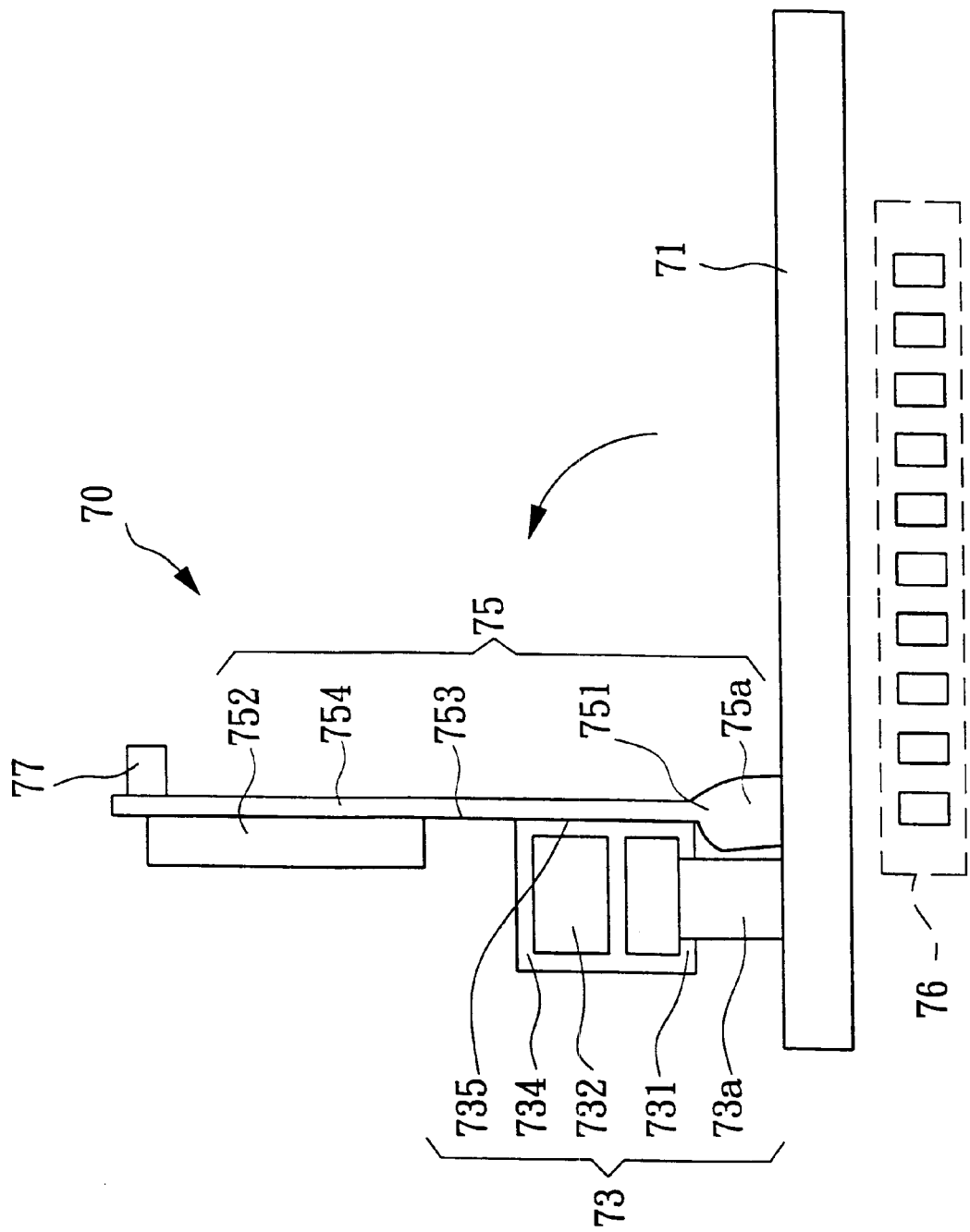
FIG. 20 is a cross-section view of the stationary vertical element 40 of the second exemplary embodiment in the vertical level.

FIGS. 19 and 20 show the stationary vertical element 70 of the second exemplary embodiment. Considering the mass, the first orientation mirror 734 and the second orientation 735 rotate earlier than the reflective mirror 44 and over the vertical level. When the reflective mirror 754 rotate over the vertical level, the first side 735 and the second side 745 provide the reflective mirror 754 to stop in the vertical level. As mention previously, the stationary vertical element 70 fixes the reflective mirror 754 in the vertical level.

As mentioned above, the present invention has been described in connection with specific exemplary embodiments, it should be appreciated that modifications or changes may be made to the embodiments of the present invention without departing from the inventive concepts contained herein.

What we claimed is:

1. An angular displacement control device for a micro mirror for fixing the micro mirror in the vertical level, comprising:
    a substrate;
    a connector section element wherein said connector section element includes the first connector section and the second connector section performed on said substrate and separated by a suitable distance;
    an actuator performed a suitable distance under said substrate;
    a fixed position element comprises of the first torsion bar performed between said first connector section and said second connector section with a suspension mode wherein said first torsion bar extends a middle part for a suitable distance including the first plane and the second plane;
    the first magnetic induction element fixed on an induced side comprising of said first plane and said second plane;
    a reflective element comprising of the second torsion bar parallel to said first torsion bar and performed between said first connector section and said second connector section with a suspension mode wherein said second torsion bar extends a middle part for a suitable distance including a third plane and a fourth plane; and
    the second magnetic induction element fixed on an induced side comprising of said third plane and said fourth plane.

2. An angular displacement control device according to claim 1, wherein said first plane is parallel to said second plane.

3. An angular displacement control device according to claim 1, wherein said third plane is parallel to said fourth plane.

4. An angular displacement control device according to claim 1, wherein said second torsion bar further comprises a bump.

5. An angular displacement control device according to claim 1, wherein said actuator is a micro conductive coil.

6. An angular displacement control device according to claim 1, wherein said first magnetic induction element is a permalloy.

7. An angular displacement control device according to claim 1, wherein said second magnetic induction element is a permalloy.

8. An angular displacement control device according to claim 1, wherein said third plane is a reflective mirror.

9. An angular displacement control device according to claim 1, wherein said fourth plane is a reflective mirror.

10. An angular displacement control device according to claim 1, wherein said first torsion bar, said second torsion bar, said bump, said orientation mirror, said reflective mirror and said bump are performed by polysilicon in lithography process.

11. An angular displacement control device for a micro mirror for fixing the micro mirror in the vertical level, comprising:
    a substrate;
    an actuator performed a suitable distance under said substrate;
    at least a fixed position element comprising of the first torsion bar which is a liftable sheet with horizontal extension and connected the first connector section of said substrate with one end of said first torsion bar whereby said first torsion bar pivots on said first connector section;
    the first magnetic induction element fixed on other end of said fixed position element;
    at least a reflective element comprising of the second torsion bar which is a liftable sheet with horizontal extension and connected the second connector section of said substrate and a third connector section of said substrate with both sides of one end of said second torsion bar whereby said second torsion bar pivots on said second connector section and said third connector section;
    the second magnetic induction element fixed the other side of said second torsion bar and far from said second connector section and said third connector section; and
    wherein said first torsion bar further comprising the first side, said first side is near a side of said second torsion bar.

12. An angular displacement control device according to claim 11, wherein said at least fixed position element further comprising the first fixed position element and the second fixed position element and an axle of said first fixed position element is parallel to as axle of said second fixed position element.

13. An angular displacement control device according to claim 11, wherein said second torsion bar further comprises a bump under said second torsion bar.

14. An angular displacement control device according to claim 11, wherein said actuator is a micro conductive coil.

15. An angular displacement control device according to claim 11, wherein said first magnetic induction element is a permalloy.

16. An angular displacement control device according to claim 11, wherein said second magnetic induction element is a permalloy.

17. An angular displacement control device according to claim 11, wherein said first torsion bar is formed of poly-silicon by lithography process.

18. An angular displacement control device according to claim 11, wherein said second torsion bar is formed of poly-silicon by lithography process.

19. An angular displacement control device according to claim 11, wherein said first torsion bar is performed an entrance near said first fixed position element.

20. An angular displacement control device according to claim 11, wherein an axle of said first torsion bar is perpendicular to an axle of said second torsion bar and said first side is perpendicular to said axle of said first torsion bar.

21. An angular displacement control device according to claim 1 wherein said angular displacement control device further comprising of an interference eliminator, comprising:
   a power with a entrance and a exit for electricity;
   the first conductive element on a vertical position element conductive with the first side of said power; and
   the second conductive element on a substrate opposite to said first conductive element.

22. An angular displacement control device according to claim 21, wherein the first terminal of said power is charged positively and the second terminal of said power is charged negatively.

23. An angular displacement control device according to claim 21, wherein the first terminal of said power is charged negatively and the second terminal of said power is charged positively.

24. An angular displacement control device for a micro mirror for fixing the micro mirror in the horizontal level, comprising:
   a power;
   an electrode element comprising of the first electrode and the second electrode wherein said first electrode and said second electrode on the first plane are separated by a suitable distance and individually connected with positive charge and negative charge of said power; and
   a fixed position element comprising of the first axle arm, the second axle arm and a connective arm wherein said first axle arm and said second axle are separated by a suitable distance, the first ends of said first axle arm and said second axle arm individually fixed on the first electrode and the second electrode, the second ends of said first axle arm and said second axle arm individually connected with two edges of said connective arm in a suspension mode whereby a circuit is formed between said first electrode and said second electrode with a horizontal suspension mode.

25. An angular displacement control device according to claim 24, wherein the second end of said first axle arm further comprising of a tenon.

26. An angular displacement control device according to claim 24, wherein the cross section of said second axle arm is larger than the cross section of said first axle arm.

27. An angular displacement control device according to claim 24, wherein said angular displacement control device further comprising of a bulge and said bulge is on a stationary vertical element.

28. An angular displacement control device according to claim 24, wherein said first electrode, said second electrode, said first axle arm, said second axle arm, said connective arm and said tenon are performed by a conductive material.

29. An angular displacement control device according to claim 28, wherein said first electrode, said second electrode, said first axle arm, said second axle arm, said connective arm and said tenon performed by cooper alloy are in a lithography process.

30. An angular displacement control device according to claim 28, wherein said first electrode, said second electrode, said first axle arm, said second axle arm, said connective arm and said tenon performed by gold alloy are in a lithography process.

31. An angular displacement control device for a micro mirror for fixing the micro mirror in the vertical level, comprising:
   a stationary vertical element to control vertical position for said micro mirror;
   a stationary horizontal element to control horizontal position for said micro mirror; and
   a interference eliminator for attracting said micro mirror by electrostatic force to eliminate magnetic interference.

32. An angular displacement control device according to claim 11 wherein said angular displacement control device further comprising of an interference eliminator, comprising:
   a power with a entrance and a exit for electricity;
   the first conductive element on a vertical position element conductive with the first side of said power; and
   the second conductive element on a substrate opposite to said first conductive element.

* * * * *